United States Patent
Ju

(10) Patent No.: US 7,309,995 B2
(45) Date of Patent: Dec. 18, 2007

(54) NONCONTACT CONDUCTIVITY MEASURING INSTRUMENT

(75) Inventor: Yang Ju, Sendai (JP)

(73) Assignee: Tohoku Techno Arch Co., Ltd. (JP)

( * ) Notice: Subject to any disclaimer, the term of this patent is extended or adjusted under 35 U.S.C. 154(b) by 0 days.

(21) Appl. No.: 10/559,921

(22) PCT Filed: Nov. 5, 2004

(86) PCT No.: PCT/JP2004/016410

§ 371 (c)(1),
(2), (4) Date: Dec. 8, 2005

(87) PCT Pub. No.: WO2005/045450

PCT Pub. Date: May 19, 2005

(65) Prior Publication Data

US 2006/0152229 A1    Jul. 13, 2006

Related U.S. Application Data

(60) Provisional application No. 60/518,758, filed on Nov. 10, 2003.

(51) Int. Cl.
*G01R 27/32* (2006.01)

(52) U.S. Cl. ..................... 324/637; 324/639

(58) Field of Classification Search .......... 324/637, 324/639

See application file for complete search history.

(56) References Cited

U.S. PATENT DOCUMENTS 5,049,816 A * 9/1991 Moslehi ............... 324/767
5,406,214 A * 4/1995 Boda et al. ............ 324/765
5,886,534 A * 3/1999 Bakhtiari et al. ....... 324/642
6,801,131 B2 * 10/2004 Donskoy et al. ....... 340/573.1
6,879,167 B2   4/2005 Ju et al.

FOREIGN PATENT DOCUMENTS

| JP | 61-173171 | 8/1986 |
| JP | 09-021837 | 1/1997 |
| JP | 2004-177274 | 6/2004 |

OTHER PUBLICATIONS

"Contactless measurement of electrical conductivity of semiconductor wafers using the reflection of millimeter waves", Ju et al., Journal of Applied Physics Letters, vol. 81n19, 2002, pp. 3585-3587.

* cited by examiner

*Primary Examiner*—Walter Benson
(74) *Attorney, Agent, or Firm*—Hayes Soloway P.C.

(57) ABSTRACT

The present invention relates to measurement of conductivity. A microwave oscillated by an oscillator using a Gunn diode is applied through an isolator, a circulator, and a horn antenna to a silicon wafer. The isolator is used for reducing the standing wave influencing the operation of the instrument. The reflected wave is received by the same horn antenna, detected by a detector connected to the circulator, and outpufted in the form of a voltage. The detector produces an output voltage proportional to the square of the amplitude of an electric field. Since the amplitude of the reflected wave from a silicon wafer is proportional to the absolute value of the reflectance, the output voltage is also proportional to the square of the absolute value of the reflectance. The reflectance is in a certain relationship with the conductivity, the conductivity of the silicon wafer can be determined.

4 Claims, 3 Drawing Sheets

| | 100 | 200 | 300 | 400 | 500 | 525 | 600 | 700 | 800 |
|---|---|---|---|---|---|---|---|---|---|
| 1000 | 0.994 | 1.000 | 1.000 | 1.000 | 1.000 | 1.000 | 1.000 | 1.000 | 1.000 |
| 700 | 0.988 | 1.001 | 1.000 | 1.000 | 1.000 | 1.000 | 1.000 | 1.000 | 1.000 |
| 600 | 0.985 | 1.001 | 1.000 | 1.000 | 1.000 | 1.000 | 1.000 | 1.000 | 1.000 |
| 500 | 0.983 | 1.001 | 1.000 | 1.000 | 1.000 | 1.000 | 1.000 | 1.000 | 1.000 |
| 450 | 0.982 | 1.001 | 1.000 | 1.000 | 1.000 | 1.000 | 1.000 | 1.000 | 1.000 |
| 400 | 0.982 | 1.000 | 1.001 | 1.000 | 1.000 | 1.000 | 1.000 | 1.000 | 1.000 |
| 350 | 0.982 | 0.999 | 1.001 | 1.000 | 1.000 | 1.000 | 1.000 | 1.000 | 1.000 |
| 300 | 0.983 | 0.995 | 1.002 | 1.000 | 1.000 | 1.000 | 1.000 | 1.000 | 1.000 |
| 250 | 0.985 | 0.989 | 1.003 | 1.000 | 1.000 | 1.000 | 1.000 | 1.000 | 1.000 |
| 200 | 0.990 | 0.977 | 1.005 | 1.001 | 1.000 | 1.000 | 1.000 | 1.000 | 1.000 |
| 150 | 0.996 | 0.957 | 1.005 | 1.004 | 1.000 | 1.000 | 1.000 | 1.001 | 1.000 |
| 100 | 1.000 | 0.918 | 0.993 | 1.016 | 1.000 | 0.998 | 0.997 | 1.000 | 1.000 |
| 70 | 0.992 | 0.878 | 0.962 | 1.039 | 1.009 | 1.001 | 0.990 | 0.996 | 1.001 |
| 50 | 0.971 | 0.836 | 0.916 | 1.072 | 1.033 | 1.014 | 0.978 | 0.982 | 1.002 |
| 30 | 0.923 | 0.776 | 0.838 | 1.137 | 1.118 | 1.062 | 0.950 | 0.930 | 0.997 |
| 20 | 0.884 | 0.738 | 0.787 | 1.177 | 1.229 | 1.113 | 0.915 | 0.870 | 0.976 |
| 15 | 0.860 | 0.717 | 0.758 | 1.189 | 1.322 | 1.142 | 0.884 | 0.826 | 0.950 |
| 10 | 0.834 | 0.695 | 0.730 | 1.178 | 1.442 | 1.156 | 0.837 | 0.773 | 0.903 |
| 5 | 0.805 | 0.673 | 0.700 | 1.127 | 1.535 | 1.116 | 0.773 | 0.712 | 0.827 |
| 3 | 0.793 | 0.664 | 0.689 | 1.092 | 1.523 | 1.073 | 0.742 | 0.687 | 0.788 |
| 1 | 0.780 | 0.656 | 0.677 | 1.047 | 1.456 | 1.012 | 0.709 | 0.661 | 0.745 |

US 7,309,995 B2

NONCONTACT CONDUCTIVITY MEASURING INSTRUMENT

CROSS-REFERENCE TO RELATED APPLICATIONS

The following application claims priority to U.S. provisional application Ser. No. 60/518,758 filed on Nov. 10, 2003 and PCT application PCT/JP2004/016410 filed on Nov. 5, 2004.

TECHNICAL FIELD

The present invention relates to measurement of conductivity, particularly to the noncontact measurement of the conductivity using a microwave.

BACKGROUND ART

The measuring method with the microwave is adopted in the noncontact conductivity measurement of a silicon wafer (see Non-Patent Reference 1 and Patent Reference 1). The noncontact measurement can be realized by using the microwave which can propagate through air. The microwave has an advantage that reaction of the microwave is directly associated with electric properties of a sample.

However, currently there is no instrument dedicated to the sample measurement with the microwave, and a network analyzer which measures an S parameter of a passive and active network of an electronic instrument is usually used as an alternative to the dedicated instrument. Because the network analyzer is large and expensive, it is difficult that the network analyzer is used as an industrial instrument.

Non-Patent Reference 1: Ju, Y., Inoue, K., Saka, M., and Abe, H., Contactless measurement of electrical conductivity of semiconductor wafers using the reflection of millimeter waves, Journal of Applied Physics Letters, Vol. 81n19, 2002, pp. 3585-3587

Patent Reference 1: Japanese Patent Laid-Open No. 2004-177274

BRIEF SUMMARY OF THE INVENTION

An object of the invention is to solve the above problems to provide a compact instrument for performing the noncontact measurement of the conductivity using the microwave.

In order to achieve the above object, the invention is a noncontact conductivity measuring instrument using a microwave, the noncontact conductivity measuring instrument characterized by including an oscillator which performs oscillation of the microwave; a circulator which is connected to the oscillator; a horn antenna which is connected to the circulator, the horn antenna transmitting the microwave to a sample and receiving a reflected wave; a detector which is connected to said circulator, the detector outputting a voltage proportional to a square of magnitude of the received microwave; and computing means for inputting said voltage to compute conductivity.

It is also possible that the circulator is in contact with the oscillator through an isolator in order to decrease a standing wave which has an influence on instrument operation.

When a silicon wafer is measured, a frequency of the microwave oscillating in the oscillator may be set at 94 GHz.

According to the above configuration, a noncontact conductivity measuring instrument having a simple and compact configuration in which

DETAILED DESCRIPTION OF THE INVENTION

Figure 1:
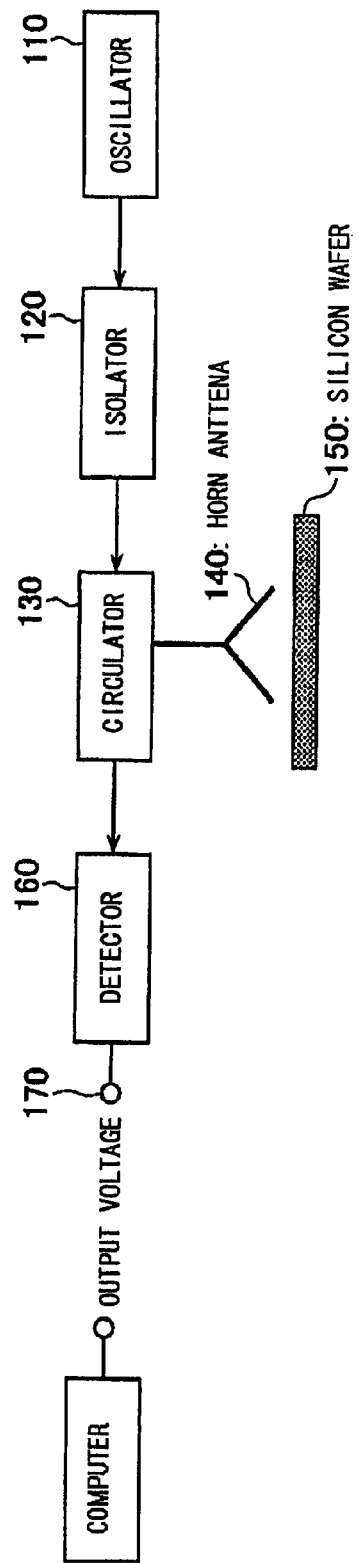
FIG. 1 is a view showing an instrument configuration of an embodiment.

An embodiment of the invention will be described below with reference to the drawings.

<Conductivity Measuring Instrument Configuration with Microwave>

A configuration of an instrument for performing the noncontact measurement of the conductivity using the microwave according to an embodiment of the invention will-be described with reference to FIG. 1. The conductivity measurement of the silicon wafer will be described below by way of example.

The microwave oscillating in an oscillator 110 with a Gunn diode is applied to a silicon wafer 150 through an isolator 120, a circulator 130, and a horn antenna 140. The isolator 120 is used in order to decrease the standing wave which has an influence on the instrument operation. Then, the reflected wave is received by the same horn antenna 140, detected by a detector 160 connected to the circulator 130, and outputted as the voltage. An output voltage proportional to the square of amplitude of an electric field is obtained in the detector 160. The output voltage is converted into a digital signal by an A/D converter (not shown) and inputted to a computer 180. Because the amplitude of the wave reflected from the silicon wafer 150 is proportional to an absolute value of reflectance, the output voltage is also proportional to the square of the absolute value of the reflectance. There is a given relationship between the reflectance and the conductivity, the conductivity of the silicon wafer 150 can be determined by computing a relation with the computer 180. A principle and the like will be described in detail below.

<Principle of Conductivity Measurement with Microwave>

Figures 2, 3:
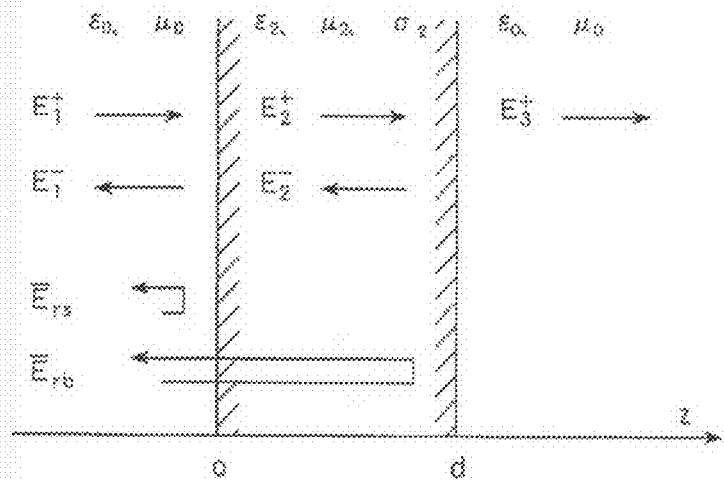
FIG. 2 is a view showing a transmission and reflection model of a microwave for a silicon wafer.
FIG. 3 is a table showing a ratio of an absolute value of reflectance |Γ|s on a silicon wafer surface and an absolute value of reflectance |Γs|, computed by equations (16) and (19)

In the above configuration, the silicon wafer conductivity measurement is performed by measuring the reflectance of the microwave with which the silicon wafer is irradiated. The principle of the silicon wafer conductivity measurement will be described below. As shown in FIG. 2, it is assumed that a three-layer slab made of materials 1, 2, and 3 is irradiated with the microwave from the material 1 in a z-axis direction. At this point, in consideration of the actual measurement, the materials 1 and 3 are set to the air and the material 2 is set to the silicon wafer. Where $E_i+$ and $E_i-$ (i=1, 2, and 3) indicate the amplitude of the electric field propagating through each material i in positive and negative directions with respect to the z axis. $\epsilon_0$ and $\mu_0$ are permittivity and permeability in the air respectively. $\epsilon_2$, $\mu_2$, and $\sigma_2$ are permittivity, permeability, and conductivity of the silicon wafer respectively, and d is a thickness of the silicon wafer. $E_{rs}$ bar is the wave reflected from a surface of the silicon wafer, i.e., from an interface between the materials 1 and 2. $E_{rb}$ bar is the microwave which is reflected from the boundary between the materials 2 and 3 to return to the material 1 after part of the irradiation microwave is incident to the silicon wafer. The wave reflected from the silicon wafer is given by a vector sum of $E_{rs}$ bar and $E_{rb}$ bar, and the amplitude of the reflected wave is $E_1^-$ bar. The electric field and a magnetic field in each material are expressed as a positional function in the z-direction.

Maxwell equations in the three-layer slab are obtained as follows:

[Formula 1]

$$\bar{E}_1(z) = \hat{x}[E_1^+ e^{-j\beta_1 Z} + E_1^- e^{j\beta_1 Z}] \quad (1)$$

$$\bar{H}_1(z) = \frac{\hat{y}}{\eta_1}[E_1^+ e^{-j\beta_1 Z} - E_1^- e^{j\beta_1 Z}] \quad (2)$$

$$\bar{E}_2(z) = \hat{x}[E_2^+ e^{-\alpha_2 z - j\beta_2 Z} + E_2^- e^{\alpha_2 z + j\beta_1 Z}] \quad (3)$$

$$\bar{H}_2(z) = \frac{\hat{y}}{\eta_2}[E_2^+ e^{-\alpha_2 z - j\beta_2 Z} - E_2^- e^{\alpha_2 z + j\beta_1 Z}] \quad (4)$$

$$\bar{E}_3(z) = \hat{x}[E_3^+ e^{-j\beta_3 Z}] \quad (5)$$

$$\bar{H}_3(z) = \frac{\hat{y}}{\eta_3}[E_3^+ e^{-j\beta_3 Z}] \quad (6)$$

$$\eta_1 = \eta_3 = \sqrt{\frac{\mu_0}{\varepsilon_0}} \quad (7)$$

$$\eta_2 = \frac{j\omega\mu}{\gamma_2} \quad (8)$$

$$\gamma_2 = \alpha_2 + j\beta_2 = j\omega\sqrt{\mu\varepsilon}\sqrt{1 - \frac{j\sigma}{\omega\varepsilon}} \quad (9)$$

$$\beta_1 = \beta_3 = \omega\sqrt{\mu_0 \varepsilon_0} \quad (10)$$

Where $E_i$ bar and $H_i$ bar indicate the electric field and the magnetic field in each of the materials (i=1 to 3). $j=\sqrt{(-1)}$, $\eta_1$ and $\eta_3$ indicate an characteristic impedance of the air, and $\eta_2$ indicates the characteristic impedance of the silicon wafer. $\gamma_2$ is a propagation coefficient of the silicon wafer, and $\alpha_2$ and $\beta_2$ show a real part and an imaginary part of $\gamma_2$ respectively. $\beta_1$ and $\beta_3$ show the imaginary part of the propagation coefficient of the air. $\omega$ is an angular frequency of the microwave. The obtained Maxwell equations satisfy boundary conditions at z=0 and z=d, given by the following equations (11) to (14).

[Formula 2]

$$\bar{E}_1(0) = \bar{E}_2(0) \quad (11)$$

$$\bar{H}_1(0) = \bar{H}_2(0) \quad (12)$$

$$\bar{E}_2(d) = \bar{E}_3(d) \quad (13)$$

$$\bar{H}_2(d) = \bar{H}_3(d) \quad (14)$$

Further, because the silicon wafer is a nonmagnetic material, the following equation can be given.

[Formula 3]

$$\mu = \mu_0 \quad (15)$$

From the above equations (1) to (15), reflectance $\Gamma$ is obtained by the following equations (16) to (18) when the microwave is incident to the silicon wafer. At this point, since the permittivity and the permeability of the silicon wafer are kept constant, $\Gamma$ is determined as a function of the conductivity $\sigma_2$ and the thickness d.

[Formula 4]

$$|\Gamma| = \left|\frac{E_1^-}{E_1^+}\right| = \left|\frac{-\eta_1\eta_2 + \eta_2\eta_3 + (\eta_2^2 - \eta_1\eta_3)\tanh(\alpha_2 d + j\beta_2 d)}{\eta_1\eta_2 + \eta_2\eta_3 + (\eta_2^2 - \eta_1\eta_3)\tanh(\alpha_2 d + j\beta_2 d)}\right| \quad (16)$$

$$\alpha_2 = \frac{1}{2}\sqrt{2\omega\mu_0\left(\sqrt{\omega^2\varepsilon_2^2 + \sigma_2^2} - \omega\varepsilon_2\right)} \quad (17)$$

$$\beta_2 = \frac{1}{2}\sqrt{2\omega\mu_0\left(\sqrt{\omega^2\varepsilon_2^2 + \sigma_2^2} + \omega\varepsilon_2\right)} \quad (18)$$

Then, the reflection of the microwave on the silicon wafer surface will be examined. Reflectance $\Gamma_S$ of the microwave on the silicon wafer surface is given by the following equation (19), and the equation (19) is the function of only the conductivity $\sigma_2$.

[Formula 5]

$$|\Gamma_S| = \left|\frac{-\eta_1 + \eta_2}{\eta_1 + \eta_2}\right| \quad (19)$$

When an absolute value of reflectance $|\Gamma_S|$ on the silicon wafer surface and an absolute value of reflectance $|\Gamma|$ are compared to each other using the equations (16) and (19), the result of a table shown in FIG. 3 is obtained. The table of FIG. 3 shows the ratio computed under the conditions of the conductivity (S/m): row and the thickness (μm): column. In FIG. 3, the difference between the absolute value of reflectance $|\Gamma_S|$ on the silicon wafer surface and the absolute value of reflectance $|\Gamma|$ is not more than 1% under the conditions of the thickness and conductivity in the shaded regions. Therefore, under these conditions, the absolute value of reflectance $|\Gamma|$ can be determined by the absolute value of reflectance $|\Gamma_S|$ on the silicon wafer surface, i.e., the conductivity σ while being independent of the thickness d.

<Frequency Used for Measurement>

The optimum microwave frequency for the conductivity measurement of the silicon wafer will be examined.

The microwave frequency applied during the conductivity measurement is determined by considering an effect of the wafer thickness for a complex conductivity and the reflectance in the frequency region. Frequency dependence of the complex conductivity of the metal material (including the silicon wafer) is given by the equation (20) from a Drude model.

[Formula 6]

$$\sigma_\omega = \frac{\sigma_{dc}}{1 - j\omega\tau} \quad (20)$$

Where ω is the angular frequency of the microwave, $\sigma_\omega$ is the complex conductivity of the silicon wafer at ω, $\sigma_{dc}$ is the conductivity (only real part) of direct current (dc) or the low frequency, τ is a mean collision time of electrons, and $j=\sqrt{(-1)}$.

The collision time of the metal (copper) is $3.33 \times 10^{-14}$ sec at room temperature. At this point, when the frequency is not more than 100 GHz, $1 \gg \omega\tau$ holds and approximation of $\sigma_\omega \cong \sigma_{dv}$ can be obtained. In this case, it may be thought that the collision time of the silicon wafer is similar to the collision time of the metal. Therefore, in the silicon wafer, it can be thought that $\sigma_{107} \cong \sigma_{dv}$ holds when the frequency is not more than 100 GHz, and it is not necessary to consider the influence of the frequency on the conductivity.

On the other hand, when the frequency is increased, microwave attenuation is increased inside the silicon wafer, which allows the reflection from the bottom surface of the wafer to be neglected. Therefore, it can be thought that the wave is reflected only from the upper surface of the wafer, and the wafer thickness does not have the influence on a response signal of the microwave. In the conductivity measurement on which the wafer thickness does not have the influence, it is desirable that a high frequency is applied.

From the two above conflicting reasons, the frequency of 94 GHz which is considered to be the most suitable for the conductivity measurement of the silicon wafer was used in the embodiment described below.

EMBODIMENT

In the configuration of the measuring instrument with the microwave, actually the silicon wafer was used to measure the conductivity.

Seven n-type silicon wafers $S_1$ to $S_7$ were prepared as a specimen. In the silicon wafers $S_1$ to $S_7$, a diameter was 100 mm, the thickness was 525±≅μm, and P was doped. The silicon wafer used in the measurement was formed by a cz method, and mirror polishing was performed to the surface used in the measurement. The silicon wafer conductivity a measured by the four-probe method ranged from 58 to 212 S/m. A copper plate, in which the conductivity was $2.8 \times 10^7$ S/m and the dimensions were 50×50×2 mm, was also prepared. It is assumed that the absolute values and the output voltages of the reflectance of the silicon wafers $S_1$ to $S_7$ are set at $|\Gamma_k|$ and $v_k$ (k=1 to 7) respectively and the reflectance and the output voltage of the copper plate are set at $|\Gamma_{cu}|$ and $v_{cu}$ respectively. At this point, because it is thought that the total reflection of the microwave is generated on the copper plate surface, i.e., $|\Gamma_{cu}|=1$, $|\Gamma_k|$ is given by the following equation.

[Formula 7]

$$|\Gamma_k| = \sqrt{\frac{v_k}{v_{cu}}} \quad (21)$$

In the measurement, a part of the microwave is reflected at the leading end of the sensor. Therefore, the microwave detected by the detector becomes the vector sum of the wave reflected from the leading end of the sensor and the wave reflected from the subject to be measured. At this point, when a phase of the wave reflected from the subject to be measured is changed from a change in stand-off distance, the detected microwave is also changed. That is, in the measurement with the microwave, it is necessary that the stand-off distance is always kept constant.

TABLE 1 shows the conductivity σ obtained by the four-probe method, the output voltage $v_k$ obtained by the microwave measurement, and reflectance $|\Gamma_k|$ obtained from the equation (21) for the seven silicon wafers. The output voltage $v_{cu}$ for the copper plate was 0.8654V.

TABLE 1

| No    | σ[S/m] | $v_k$ [V] | $|\Gamma_k|$ |
|-------|--------|-----------|--------------|
| $S_1$ | 58.2   | 0.179     | 0.455        |
| $S_2$ | 63.3   | 0.194     | 0.473        |
| $S_3$ | 78.9   | 0.226     | 0.511        |
| $S_4$ | 91.7   | 0.249     | 0.536        |
| $S_5$ | 125.0  | 0.306     | 0.595        |
| $S_6$ | 205.2  | 0.408     | 0.686        |
| $S_7$ | 212.0  | 0.416     | 0.693        |

The difference was observed between $|\Gamma_k|$ and $|\Gamma_s|$. This is attributed to the influence of the reflection except for the silicon wafer surface, directivity of the sensor, microwave leakage in the component of the instrument, and the like. However, there is the one-to-one relationship in the $|\Gamma_k|$ and the conductivity. Therefore, the conductivity of the silicon wafer can be measured by measuring the absolute value of reflectance $|\Gamma_k|$.

Then, whether the conductivity measurement is enabled or not will be examined. First the relation between the absolute value of effective reflectance and the conductivity was determined using $S_1$, $S_3$, $S_5$, and $S_7$.

Figure 4:
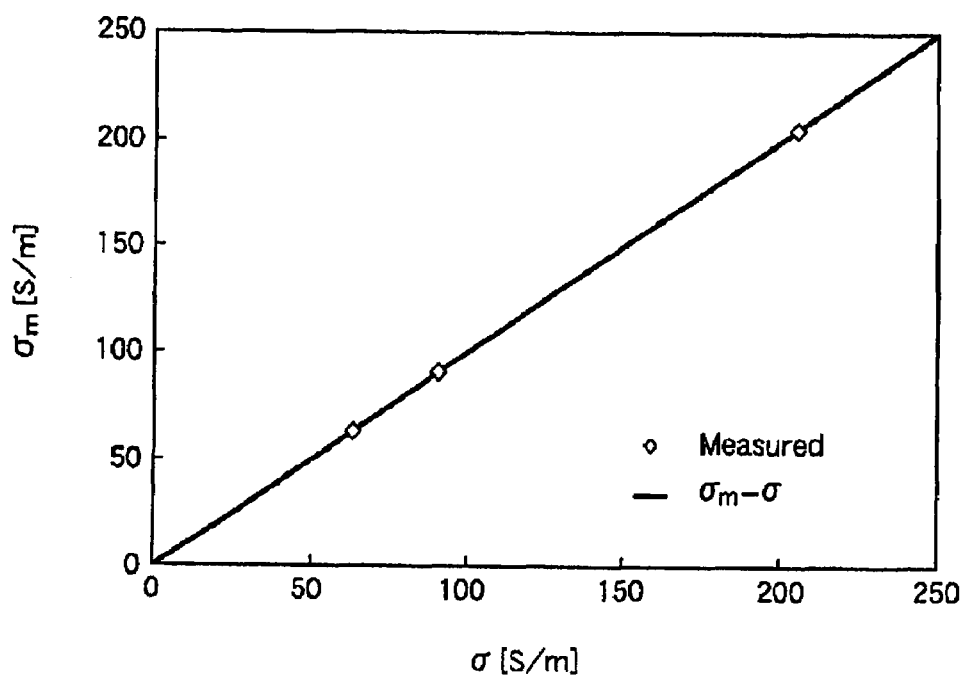
FIG. 4 is a view showing a graph of comparison of a conductivity obtained by the instrument shown in FIG. 1 and a conductivity obtained by a conventional four-point probe method. the microwave is used can be provided.

[Formula 8]

$$\sigma_m = C_1|\Gamma_k|^3 = C_2|\Gamma_k|^2 = C_3|\Gamma_k| = C_4 \quad (22)$$

Where $\sigma_m$ is the conductivity evaluated by the microwave measurement of the configuration shown in FIG. 1, $C_i$ (i=1 to 4) is a constant, and $C_1$=412.4 S/m, $C_2$=407.1 S/m, $C_3$=128.5 S/m, and $C_4$=10.4 S/m. Then, $\sigma_m$ was determined for $S_2$, $S_4$, and $S_6$ using the obtained relation (22). The results are shown in FIG. 4. As shown in FIG. 4, there is a good agreement between the evaluation result and the measurement result obtained by the four probe method, and it was proved that the noncontact evaluation of the conductivity was able to be performed. Accordingly, it is expected that the on-line conductivity evaluation of the silicon wafer is performed independently of the thickness of the silicon wafer.

It is thought that the permittivity and the permeability of the silicon wafer are constant. At this point, the conductivity of the silicon wafer can be determined by the equation (22) using the microwave when the experimental conditions are similar to the above conditions. Even if the experimental conditions such as the stand-off distance and the sensor are changed, the conductivity can be evaluated by determining the constant $C_i$ again with the several silicon wafers.

Further, when the permittivity and the permeability are constant, the conductivity can be evaluated for the materials, such as gallium arsenide (GaAs), except for the silicon wafer by determining the constant $C_i$ with the several specimens.

The invention claimed is:
1. A measuring instrument for noncontact measurement of conductivity of a silicon wafer using a microwave, the measuring instrument comprising:
   an oscillator operating at a frequency not more than 100 GHz for oscillating the microwave;
   a circulator connected to the oscillator;
   a horn antenna connected to the circulator, the horn antenna transmitting the microwave to an upper surface of the silicon wafer and receiving a reflected wave from the upper surface of the silicon wafer;

a detector connected to said circulator, the detector outputting a voltage proportional to a square of magnitude of the wave from the upper surface of said silicon wafer; and a computer for computing conductivity of said silicon wafer from said voltage.

2. A measuring instrument according to claim 1, wherein said circulator is connected to the oscillator through an isolator.

3. A measuring instrument according to claim 1, wherein a frequency of the microwave oscillating in said oscillator is 94 GHz.

4. A measuring instrument according to claim 2, wherein a frequency of the microwave oscillating in said oscillator is 94 GHz.

* * * * *